(12) United States Patent
Nguyen et al.

(10) Patent No.: US 11,114,314 B2
(45) Date of Patent: Sep. 7, 2021

(54) METHOD FOR FABRICATION OF A SEMICONDUCTOR STRUCTURE INCLUDING AN INTERPOSER FREE FROM ANY THROUGH VIA

(71) Applicant: Soitec, Bernin (FR)

(72) Inventors: Bich-Yen Nguyen, Austin, TX (US); Ludovic Ecarnot, Vaulnaveys-le-Haut (FR); Nadia Ben Mohamed, Echirolles (FR); Christophe Malville, Lumbin (FR)

(73) Assignee: Soitec, Bernin (FR)

( * ) Notice: Subject to any disclaimer, the term of this patent is extended or adjusted under 35 U.S.C. 154(b) by 145 days.

(21) Appl. No.: 16/305,695

(22) PCT Filed: May 24, 2017

(86) PCT No.: PCT/EP2017/062556
§ 371 (c)(1),
(2) Date: Nov. 29, 2018

(87) PCT Pub. No.: WO2017/207390
PCT Pub. Date: Dec. 7, 2017

(65) Prior Publication Data
US 2020/0328094 A1    Oct. 15, 2020

(30) Foreign Application Priority Data

May 30, 2016 (FR) ...................... 1654831

(51) Int. Cl.
*H01L 21/56* (2006.01)
*H01L 21/48* (2006.01)
*H01L 21/78* (2006.01)

(52) U.S. Cl.
CPC ........ *H01L 21/568* (2013.01); *H01L 21/4857* (2013.01); *H01L 21/78* (2013.01)

(58) Field of Classification Search
CPC ... H01L 21/568; H01L 21/4857; H01L 21/78; H01L 25/0655; H01L 21/26506;
(Continued)

(56) References Cited

U.S. PATENT DOCUMENTS 6,503,778 B1   1/2003 Yamauchi et al.
7,498,245 B2 *  3/2009 Aspar ............... H01L 21/76254
                                                            438/459
(Continued)

FOREIGN PATENT DOCUMENTS

| EP | 0853337 A1 | 7/1998 |
| EP | 1014452 A1 | 6/2000 |
| EP | 1517363 A2 | 3/2005 |
| FR | 2748851 A1 | 11/1997 |
| WO | 2007/104767 A1 | 9/2007 |
| WO | 2009/106177 A1 | 9/2009 |

OTHER PUBLICATIONS

Lagahe-Blanchard et al., Hydrogen and Helium Implantation to Achieve Layer Transfer, Semiconductor Wafer Bonding VII: Science, Technology, and Applications, Proceedings of the International Symposium, vol. 19, (Apr.-May 2003), pp. 346-358.
(Continued)

*Primary Examiner* — Vu A Vu
(74) *Attorney, Agent, or Firm* — TraskBritt

(57) ABSTRACT

A method of forming a semiconductor structure includes introducing, at selected conditions, hydrogen and helium species (e.g., ions) in a temporary support to form a plane of weakness at a predetermined depth therein, and to define a superficial layer and a residual part of the temporary support; forming on the temporary support an interconnection layer; placing at least one semiconductor chip on the interconnection layer; assembling a stiffener on a back side of the at least one semiconductor chip; and providing thermal energy to the temporary support to detach the residual part and provide the semiconductor structure. The interconnection layer forms an interposer free from any through via.

18 Claims, 3 Drawing Sheets

(58) Field of Classification Search
CPC . H01L 23/5383; H01L 23/3121; H01L 24/80; H01L 24/81; H01L 24/83; H01L 24/92; H01L 24/94; H01L 24/97; H01L 21/7624; H01L 21/6835; H01L 24/08; H01L 24/11; H01L 24/13; H01L 24/16; H01L 24/32; H01L 2221/68318; H01L 2221/6835; H01L 2221/68359; H01L 2221/68377; H01L 2221/68381; H01L 2224/02313; H01L 2224/02331; H01L 2224/0239; H01L 2224/08145; H01L 2224/08225; H01L 2224/1148; H01L 2224/13024; H01L 2224/16145; H01L 21/561; H01L 24/02; H01L 2224/83005; H01L 2224/80894; H01L 2224/29024; H01L 24/29; H01L 2224/05548; H01L 2224/11849; H01L 2224/16227; H01L 2224/32145; H01L 2224/80006; H01L 2224/81005; H01L 2224/81193; H01L 2224/8385; H01L 2224/92; H01L 2224/94; H01L 2224/97; H01L 2924/19107; H01L 2924/381; H01L 25/0657; H01L 25/50
USPC .......................................................... 438/113
See application file for complete search history.

(56) References Cited

U.S. PATENT DOCUMENTS

| | | |
|---|---|---|
| 9,209,142 B1 * | 12/2015 | Lambert .................. H01L 24/75 |
| 2003/0219969 A1 | 11/2003 | Saito et al. |
| 2010/0075461 A1 | 3/2010 | Clavelier et al. |
| 2010/0109169 A1 | 5/2010 | Kolan |
| 2013/0037959 A1 | 2/2013 | Nguyen et al. |
| 2013/0214423 A1 | 8/2013 | Sadaka |
| 2013/0252383 A1 | 9/2013 | Chen |
| 2014/0191419 A1 | 7/2014 | Mallik et al. |
| 2014/0339706 A1 | 11/2014 | Yee et al. |

OTHER PUBLICATIONS

International Written Opinion for International Application No. PCT/EP2017/062556 dated Oct. 30, 2017, 17 pages.

International Search Report for International Application No. PCT/EP2017/062556 dated Oct. 30, 2017, 11 pages.

Taiwan Office Action for TW Application No. 106117418 dated Jul. 28, 2020, 12 pages.

French Research Report Partial Preliminary from French Application No. 1654831, dated Jan. 31, 2017, 18 Pages with English translation.

French Written Opinion from French Application No. 1654831, dated Jan. 31, 2017, 29 Pages with English translation.

* cited by examiner

METHOD FOR FABRICATION OF A SEMICONDUCTOR STRUCTURE INCLUDING AN INTERPOSER FREE FROM ANY THROUGH VIA

CROSS-REFERENCE TO RELATED APPLICATIONS

This application is a national phase entry under 35 U.S.C. § 371 of International Patent Application PCT/EP2017/062556, filed May 24, 2017, designating the United States of America and published in English as International Patent Publication WO 2017/207390 A1 on Dec. 7, 2017, which claims the benefit under Article 8 of the Patent Cooperation Treaty to French Patent Application Serial No. 1654831, filed May 30, 2016.

TECHNICAL FIELD

The present disclosure relates to a method for fabrication of a semiconductor structure including an interposer.

BACKGROUND

Interposers are commonly used as passive elements enabling the stacking of semiconductor chips or dies side by side, connecting them to each other and to their external environment. Interposers allow mixing of chips or dies having different functions (processing units, memory, input/output) to form packaged semiconductor devices presenting high bandwidth configurations and compact form factors. It avoids integrating all the functional elements at the die level, and accelerates development time of devices.

US2013/0214423 recalls that an interposer is usually formed of a sufficiently thick layer of material in order to be rigid (for instance, of about 200 micrometers or more), presenting on its opposing faces contact pads for connection to the semiconductor chips and/or to external connectors. An interposer also comprises conductive vias that extend through it, to electrically connect contact pads on its opposing faces.

It is usually difficult to form vias having high aspect ratio (defined as the length of a via divided by the dimension of its section), for instance, a ratio greater than 5. Therefore, vias have a minimum cross-sectional dimension that is typically greater than 20 micrometers. This dimension limits the number of vias that can be formed in a given surface of the interposer and, therefore, limits the integration density of the final, packaged, semiconductor device. Less compact devices are problematic as such, since they may not be placed in items having a small dimension (smart phones, connected watches, etc.). Less compact devices also limit the performance, since the necessary longer connection lines may affect the bandwidth and latency of propagating signals.

New interposer approaches, such as the one described in US2014/0191419, that do not require through vias, are receiving increased attention.

For instance, US2003/0219969 discloses a manufacturing method of a semiconductor device that is packaged with a fine-structured interposer that is fabricated using a silicon substrate. The method includes the steps of forming a peelable resin layer on a silicon substrate, forming the wiring layer on the peelable resin layer, mounting semiconductor chips on the wiring substrate, forming semiconductor devices by sealing the plurality of semiconductor chips by a sealing resin, individualizing the semiconductor devices by dicing the semiconductor devices from the sealing resin side but leaving the silicon substrate, and peeling each of the individualized semiconductor devices from the silicon substrate.

This manufacturing process is particularly difficult to implement. It requires fine control of the adhesive forces at the successive interfaces in the structure such that on applying traction forces on the devices, it is possible remove the complete device from the substrate precisely at the resin layer. At the same time, the resin layer should provide sufficient adhesion to hold together the different layers on the silicon substrate during the initial stage of the manufacturing process.

BRIEF SUMMARY

The present disclosure aims to form a semiconductor device including at least one semiconductor chip or die, and an interposer to route the electrical signals from/to conductive features of the at least one semiconductor chip. The interposer is free from any through via and the manufacturing process is simple to implement.

To this effect, the disclosure relates to a method of forming a semiconductor structure that comprises:
  implanting hydrogen and helium ions in a temporary support, at selected implantation conditions, to form a plane of weakness at a predetermined depth therein, and to define a superficial layer and a residual part of the temporary support;
  forming on the temporary support an interconnection layer, the interconnection layer comprising contact pads and electrically conductive paths between the contact pads;
  placing at least one semiconductor chip on the interconnection layer to electrically couple conductive features of the chip with contact pads of the interconnection layer;
  assembling a stiffener on a back side of the at least one semiconductor chip;
  providing thermal energy and, optionally, mechanical energy, to the temporary support to detach the residual part and provide the semiconductor structure.

The step of providing thermal energy to the temporary support further weakens the plane of weakness and may at the same time reinforce the adhesion of the stiffener to the rest of the structure. It facilitates the detachment of the residual part of the support and its removal by application of moderate forces, and without the risk of detaching the stiffener from the rest of the structure.

According to further non limitative features of the disclosure, either taken alone or in any technically feasible combination:
  the selected conditions of introduction of the helium species comprises implanting helium ions at a dose between $1 \times 10^{16}$ at/cm$^3$ and $2 \times 10^{16}$ at/cm$^3$; and at an implantation energy between 40 keV to 200 keV;
  the selected conditions of introduction of the hydrogen species comprises implanting hydrogen ions at a dose between $0.5 \times 10^{16}$ at/cm$^3$ and $1.5 \times 10^{16}$ at/cm$^3$; and at an implantation energy between 25 keV to 200 keV;
  the interconnection layer presents a first surface on the side of the semiconductor chip and a second surface opposite the first surface, and wherein the contact pads are disposed on both the first and second surfaces;
  the method comprises removing the superficial layer after the detachment of the residual part to expose at least some contact pads of the second surface of the interconnection layer;

the method comprises forming emerging features, such as microbumps or metal studs, on the contact pads of the first surface to facilitate the electrical coupling of conductive features of the semiconductor chip with the contact pads;

the method comprises forming elementary devices on and/or in the superficial layer;

the superficial layer presents a thickness less than about 10 micrometers, preferably less than 1 micrometer, and more preferably between 50 nm and 600 nm;

the distance separating two juxtaposed contact pads is between 0.2 micrometer to 2 micrometers;

the assembling step is performed after or before the step of placing the at least one semiconductor chip on the interconnection layer;

the assembling step further comprises a step of underfilling to provide a filling material in the free space surrounding the at least one chip;

the method comprises a step of dicing the semiconductor structure to provide at least one raw semiconductor device, and a step of packaging the at least one raw semiconductor device to form a final semiconductor device;

the interconnection layer presents a thickness between 200 nm and 20 micrometers;

the thermal budget associated with the formation of the interconnection layer is less than 250° C. for 4 hours or is less than 20 minutes at 350° C.;

the step of providing thermal energy comprises applying a temperature between 200° C. and 450° C. for a period between 10 minutes and 2 hours.

BRIEF DESCRIPTION OF THE DRAWINGS

Many other features and advantages of this disclosure will become apparent from reading the following detailed description, when considered in conjunction with the accompanying drawings, in which.

DETAILED DESCRIPTION

For simplification of the following description, the same references are used for identical elements or elements achieving the same function in the different embodiments of the disclosure that will be described.

Figure 1:
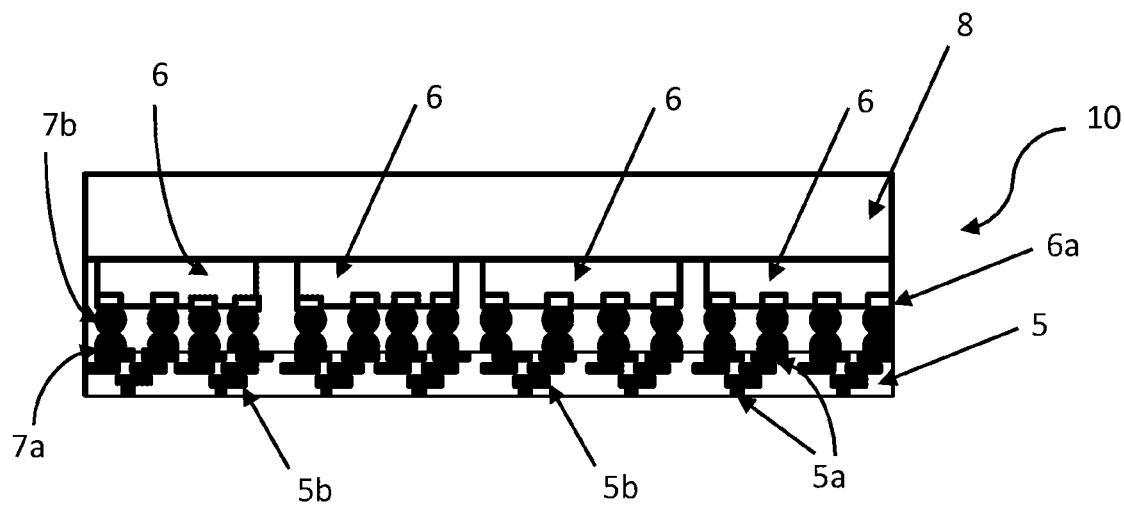
FIGS. 1 and 2 represent semiconductor structures that can be fabricated by the method disclosed herein.

FIG. 1 represents a semiconductor structure 10 that can be fabricated by the method of the present disclosure.

The semiconductor structure 10 comprises an interposer consisting of an interconnection layer 5. The interconnection layer 5 comprises contact pads 5a preferably disposed on both of its surfaces; and electrically conductive paths 5b between the contact pads 5a. The interconnection layer 5 may present a thickness between 200 nm and 20 micrometers, and typically between 5 micrometers and 10 micrometers. Some contact pads 5a are electrically coupled to conductive features 6a of at least one semiconductor chip 6. Other contact pads 5a, in particular, those disposed on the exposed surface of interconnection layer 5, may provide external input/output connection of the semiconductor structure 10.

As represented on FIG. 1, the contact pads 5a may be disposed on each surface of the interconnection layer 5 at a great density. For instance, the distance separating two juxtaposed contact pads 5a may be between 0.2 micrometer to 2 micrometers.

Preferably, a plurality of semiconductor chips 6 are disposed over and electrically coupled to the interconnection layer 5. The semiconductor chips 6 may be of a different size, have different functions and be made according to different technologies. For instance, one semiconductor chip 6 may be a 14 nm technology CPU, while another semiconductor chip 6 may be a 0.25 micrometer technology input/output chip. Each semiconductor chip 6 may be, for instance, a DRAM or a SRAM memory chip, a CPU, a GPU, a microcontroller, or an input/output chip.

Optionally, the semiconductor structure 10 may comprise additional semiconductor chips 6 positioned on the exposed surface of the interconnection layer 5 (not represented on FIG. 1).

Interconnection layer 5 enables integration of those different chips having different functions in order to become a functional semiconductor device. Electrically conductive paths 5b of interconnection layer 5 electrically connects the conductive features 6a of the different semiconductor chips 6 together so they can functionally cooperate. To allow the complex interconnection scheme, the interconnection layer 5 may be composed of a plurality of stacked interconnection sublayers, for instance, 2 to 4 sublayers.

To facilitate the electrical coupling of the conductive features 6a of semiconductor chips 6 with the contact pads 5a of the interconnection layer 5, the contact pads and/or the conductive features 6a may be provided with emerging features 7a, 7b, such as micro bumps.

The semiconductor structure 10 of FIG. 1 also comprises a stiffener 8 placed on the back side of the semiconductor chips 6 to provide a rigid support to the structure. Stiffener 8 may be made of any suitable material, such as silicon or epoxy material. The free space between the semiconductor chips 6, the stiffener 8 and the interconnection layer 5 may be filled with insulating filling material, such as silicon dioxide, for protection and increased rigidity of the semiconductor structure 10.

Figure 2:
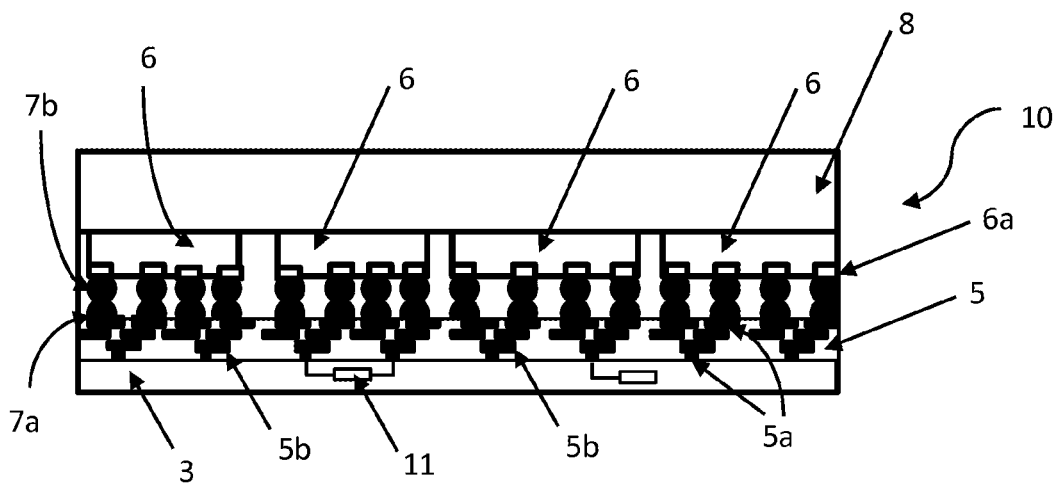

Optionally, and as represented on FIG. 2, the semiconductor structure 10 may comprise a superficial layer 3 over, or partially over, the interconnection layer 5, on its surface opposite the semiconductor chips 6. The superficial layer 3 may comprise elementary devices 11 coupled to some of the contact pads 5a of the interconnection layer 5. Elementary devices 11 may provide additional functions to the semiconductor chips 6. They may correspond, for example, to thin film transistors, PN diodes, or photonics devices.

The semiconductor structure 10 of FIG. 1 or FIG. 2 may be diced to form raw semiconductor devices, which may then be packaged to form final semiconductor devices as it is usual in the art. Packaging may comprise the formation of wire bonds on some of the contact pads 5a disposed on the exposed surface of interconnection layer 5 to provide external connection to the devices.

The present disclosure is directed to a method of fabrication of the semiconductor structure 10, such as the one represented on FIG. 1 or FIG. 2.

Figure 3:
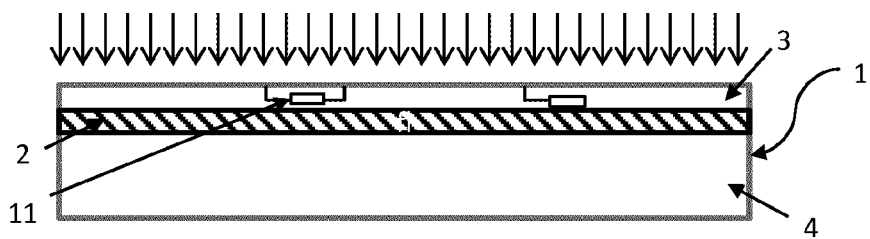
FIG. 3 represents a step of introducing hydrogen and helium species in a temporary support.

With reference to FIG. 3, the method comprises a step of introducing hydrogen and helium species, such as hydrogen ions and helium ions, in a temporary support 1 to form a plane of weakness 2 at a predetermined depth in the temporary support 1. The hydrogen and helium species may be introduced by implantation. The plane of weakness 2 defines a superficial layer 3 and a residual part 4 of the temporary support 1.

For reasons of cost and availability, the support may correspond to a silicon wafer of circular shape and of normalized dimensions. For instance, the silicon wafer may have a diameter of 200 mm or 300 mm, and a thickness between 300 micrometers and 900 micrometers, but the method according to the disclosure is not limited to such material, shape and size of the temporary support. In general terms, the temporary support is selected to provide a cheap, rigid, self-supporting piece of material. The temporary support 1 may be coated with one or more surface layers of material, such as a semiconductor material, a conductor material or an insulating material. Consequently, superficial layer 3 may also comprise one or more of the surface layers of temporary support 1.

Depending on the implantation conditions that will be described in greater detail in a following part of this description, the superficial layer 3 may have a thickness less than about 10 micrometers, or less than 1 micrometer. Preferably, this thickness is between 50 nm and 600 nm. In some instances, the superficial layer 3 will be completely removed from the final structure, such that its thickness is not of particular importance. A thinner superficial layer 3, nevertheless, facilitates its removal.

The superficial layer thickness is typically 10 or 20 micrometers lower than the thickness of the residual part 4. Therefore, the thickness of the residual part 4 is very similar to the thickness of the temporary support 1.

The plane of weakness 2 is provided to allow and to facilitate the removal of the temporary support (and, more precisely, of the residual part 4 of the temporary support 1) in a subsequent detachment step of the method for fabricating the semiconductor structure 10.

The plane of weakness 2 should, therefore, be precisely controlled such that it remains sufficiently stable in the following step of the process, prior to the removal of the residual part 4. The weakening of the plane of weakness 2 may be particularly affected by the thermal budgets involved in these following steps. By "sufficiently stable," it is meant that the weakening of the plane of weakness 2, or any other evolution of the plane of weakness 2 during the following steps of the method prior to detachment, should not develop into the deformation of the superficial layer 3 (for instance, through blistering of the implanted surface) or should not provoke the premature detachment of the residual part 4.

The plane of weakness 2 should, however, be sufficiently weakened, such that providing a reasonable amount of energy at the detachment step allows the removal of the residual part 4.

According to the disclosure, the degree of weakening of plane of weakness 2 is precisely controlled by selecting the condition of introduction (i.e., implantation) of the hydrogen and helium species. The selection should take into consideration the material of the temporary support 1 that may affect the evolution of the weakening of the plane of weakness 2, and also take into consideration the thermal budgets (or, more generally, the energy budget) associated with the processing steps applied to the temporary support prior to the detachment step.

For instance, implantation of hydrogen and helium ions may be performed at the following implantation conditions, in particular, in a silicon temporary support:

- A hydrogen dose of between $0.5 \times 10^{16}$ at/cm$^3$ and $1.5 \times 10^{16}$ at/cm$^3$; and at an implantation energy of 25 keV, or, more generally, between 10 keV and 200 keV, or between 10 keV and 80 keV.
- A helium dose between $1 \times 10^{16}$ at/cm$^3$ and $2 \times 10^{16}$ at/cm$^3$; and at an implantation energy of 40 keV or, more generally, between 10 keV and 200 keV, or between 10 keV and 80 keV.

The hydrogen ions and the helium ions may be successively implanted in the temporary support 1, for instance, by implanting first the helium ions. It is also possible to implant the hydrogen ions first. Generally speaking, the implantation energy of the helium and hydrogen species are selected in the proposed ranges, such that the peaks of their respective distribution profile along the depth of the temporary support are located close to each other, i.e., less than 150 nm.

With these implanted species and implantation conditions, it has been shown that the temporary support may receive a thermal budget equivalent to about 4 hours of treatment at 250° C. without exhibiting surface deformation or provoking detachment of the residual part 4. By "equivalent thermal budget," it is meant that higher temperature during a shorter period of time, or a lower temperature for a longer period of time, may also be applied to the temporary support 1.

It is also to be noted that this thermal budget is applied to the temporary support without providing a stiffener to the implanted surface. Therefore, and for the same implantation conditions and applied thermal budget, the dynamics of blister development is different from the fracture dynamics of an implanted substrate that would have been provided with a stiffener.

The inventors of the present disclosure have observed that the acceptable thermal budget (i.e., that does not provoke surface deformation and/or premature detachment) is wider than the one that could have been applied to a temporary support provided with a plane of weakness that would have been formed by hydrogen species alone, helium species alone, or any other species. They have notably observed that it is possible to apply a thermal budget of 4 hours of treatment at 250° C. (or less) or a thermal budget of 350° C. for 20 minutes (or less) without exhibiting surface deformation or provoking detachment of the residual part 4.

In some instances, the method according to the disclosure may comprise a step of forming elementary devices 11 in and/or on the superficial layer 3. This step may be performed before or after the formation of the plane of weakness 2. Elementary devices 11 may correspond to thin film transistors, PN diodes, or photonics devices, for instance. Preferably, elementary devices are performing simple electrical or light guiding functions that do not require high performance levels since the material quality of superficial layer 3 may be deteriorated by the formation of the plane of weakness 2.

Elementary devices are formed by all techniques known in the semiconductor industry, such as deposition, etching, dopant implantation or diffusion, etc.

The elementary devices 11 may be formed after the formation of the plane of weakness 2, but, preferably, elementary devices 11 are formed before such that their formation does not contribute to the acceptable thermal budget that may be received by temporary support 1.

The thermal budget associated with the formation of elementary devices 11, in the case when they are formed after the creation of the plane of weakness 2, should be much less than the acceptable thermal budget, i.e., much less than about 250° C. for 4 hours or much less than about 350° C. for 20 minutes, for instance.

Figure 4:
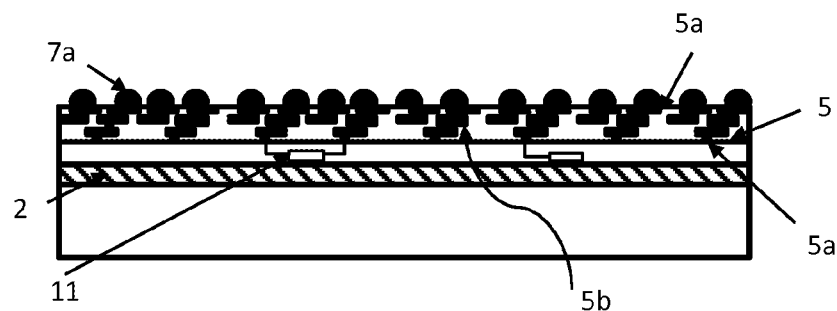
FIG. 4 represents a step of forming an interconnection layer.

As represented in FIG. 4, the method according to the disclosure also comprises a step of forming, on the temporary support 1, the interconnection layer 5 comprising contact pads 5a and an electrically conductive path 5b between the contact pads 5a.

At this stage of the process, the interconnection layer 5 presents a first surface in contact with the temporary support 1 and a second, exposed, surface. Preferably, the contact pads 5a are disposed on both surfaces of the interconnection layer 5.

The interconnection layer 5 may be formed using a conventional technique such as metallization or dual damascene. It may comprise successive steps of dielectric deposition, etching according to defined photoresist patterns, barrier deposition, aluminum or copper deposition (for instance, by electroplating), and planarization (for instance, by chemical-mechanical planarization). The interconnection layer 5 may comprise a plurality of stacked interconnected sublayers, for instance, two to four sublayers, to create a more complex interconnection scheme. The interconnection scheme is designed such that the semiconductor chip 6 of the semiconductor structure 10 are functionally coupled together and to external connections.

The thermal budget associated with the formation of the interconnection layer 5 is typically below 250° C. for a few hours, depending on the number of sublayers included in the interconnection layer 5. In combination with all other thermal budgets that precede the detachment step, it should not exceed the acceptable thermal budget of, for instance, 4 hours of treatment at 250° C.

Because the contact pads 5a and electrically conductive paths 5b are essentially formed by deposition technique, the interconnection layer 5 does not require the formation of vias in a thick and rigid material. The density of contact pads 5a at the first or second surface can be particularly high. For instance, the distance separating two juxtaposed contact pads 5a may be between 0.2 micrometer and 2 micrometers. The dimension of each pad (of its surface section) may be of the same size, between 0.2 micrometer and 2 micrometers. This is at least five times smaller than the dimension of a typical via that are necessary in the traditional interposer approach.

This step of forming the interconnection layer 5 may also comprise forming emerging features 7a on at least some of the contact pads 5a of the exposed surface to facilitate coupling with the conductive features 6a of the semiconductor chips 6. The emerging features 7a on contact pads 5a may comprise micro bumps. Such emerging features 7a may be formed by selective metal growth on the conductive features 6a. Alternatively, metal studs may be formed by etching the insulating material surrounding the conductive features 6a to have them emerge over the exposed surface, followed by melting the emerging metal to form the studs.

If the process of forming the emerging features 7a involves significant thermal budget, the overall thermal budget applied to the plane of weakness 2 that precedes the detachment step, should not exceed the acceptable thermal budget of, for instances, 4 hours of treatment at 250° C. or 20 minutes at 350° C.

Figure 5:
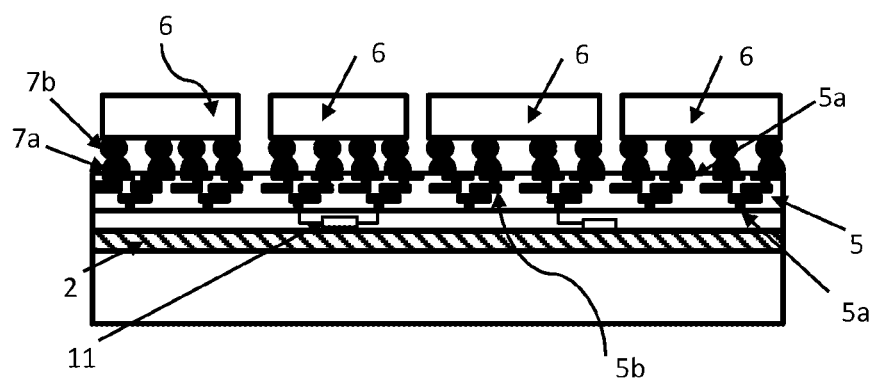
FIG. 5 represents a step of placing at least one semiconductor chip on the interconnection layer.

As represented on FIG. 5, the method of fabricating the semiconductor structure 10 further comprises a step of placing at least one semiconductor chip 6 on the interconnection layer 5 and electrically coupling the conductive feature 6a of the semiconductor chip 6 with contact pads 5a.

The semiconductor chip 6 may comprise emerging features 7b, similar to those described in reference to emerging features 7a formed on contact pads 5a, such as micro bumps or metal studs to facilitate their electrical connection to the interconnection layer 5. The emerging features 7b of the semiconductor chips 6 may contact the emerging features 7a of interconnection layers (as represented in FIG. 5) or directly be in contact with contact pads 5a.

Alternatively, a direct contact may be formed between the conductive features 6a of the semiconductor chips 6 and the contact pads 5a, for instance, by direct "molecular" bonding or adhesive bonding of the two elements.

Preferably, the step of placing at least one semiconductor chip 6 involves placing a plurality of semiconductor chips 6. This can be achieved by well known "pick and place" techniques.

This step is preferably performed at room temperature, such that it does not contribute significantly to the acceptable thermal budget that precedes the detachment step.

As explained above, the semiconductor chips 6 may be of a different size, technology and function. Each semiconductor chip 6 may be a DRAM or SRAM memory, a CPU, a GPU, a microcontroller, or an input/output device.

A selected group of chips, for instance, a DRAM chip, a GPU chip and an I/O chip, can be placed at their intended position on the interconnection layer 5 and electrically coupled together by the interconnection layer 5 in a functional way.

The semiconductor structure 10 may be composed of a plurality of such groups so that, after dicing and packaging, a plurality of semiconductor devices can be manufactured collectively.

Once the semiconductor chips 6 have been placed on the interconnection layer 5, the free space surrounding the semiconductor chips 6, over the interconnection layer 5 may be filled with an insulating filling material 9, to protect and rigidify the assembly. The filling material may consist of silicon oxide disposed on interconnection layer 5 and around the semiconductor chips 6 by a spin-on-glass technique. The deposition and underfilling of the material is facilitated if it the material has a low density.

Figure 6:
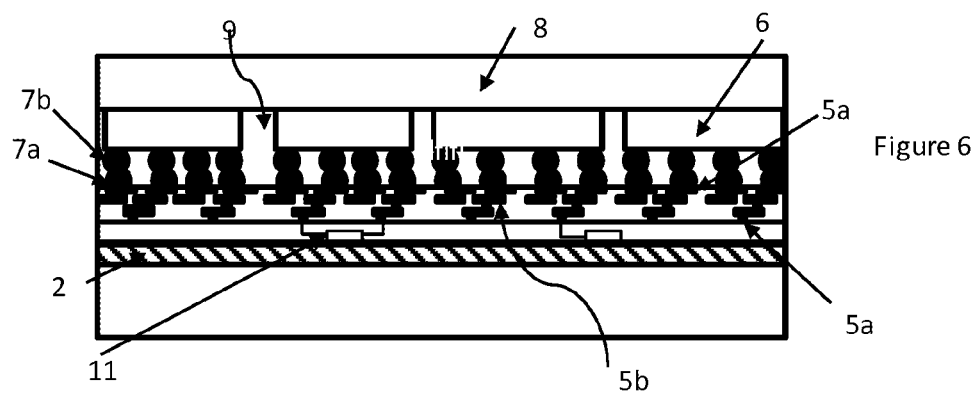
FIG. 6 represents a step of assembling a stiffener.

Preferably, and as represented on FIG. 6, the process according to the disclosure also comprises a step of assembling a stiffener 8 on the back side of the semiconductor chips 6. The stiffener 8 is made of a sufficiently thick and rigid material such that the semiconductor structure 10 is self-standing once the temporary support 1 is removed.

The stiffener 8 can be made, for instance, of a silicon wafer or a piece of epoxy material. Its dimension should at least correspond to the dimension of the temporary support 1.

The assembly can be made by adhesive bonding, by direct bonding or any other technique. Preferably, the chosen technique does not involve exposure to temperatures higher than room temperature, to avoid affecting the plane of weakness 2 and to provoke the premature detachment of the residual part 4 of the temporary support 1.

In an alternative approach, the back side of the semiconductor chips 6 may be first positioned and fixed at a predetermined position on the stiffener 8, and then the assembly formed of the semiconductor chips 6 and stiffener 8 is placed over interconnection layer 5 and electrically coupled to all conductive features 6a of the semiconductor chips 6 with contact pads 5a.

Whatever the chosen approach for placing the semiconductor chips 6 on the interconnection layer 5 and assembling the stiffener 8, the process results in the configuration represented in FIG. 6.

If the process of assembling the stiffener or the step of underfilling the space around the semiconductor chip 6 with insulating filling material 9 involves significant thermal budget, the overall thermal budget applied to the plane of weakness 2 that precedes the detachment step, should, however, not exceed the acceptable thermal budget of, for instance, 4 hours of treatment at 250° C.

Figure 7:
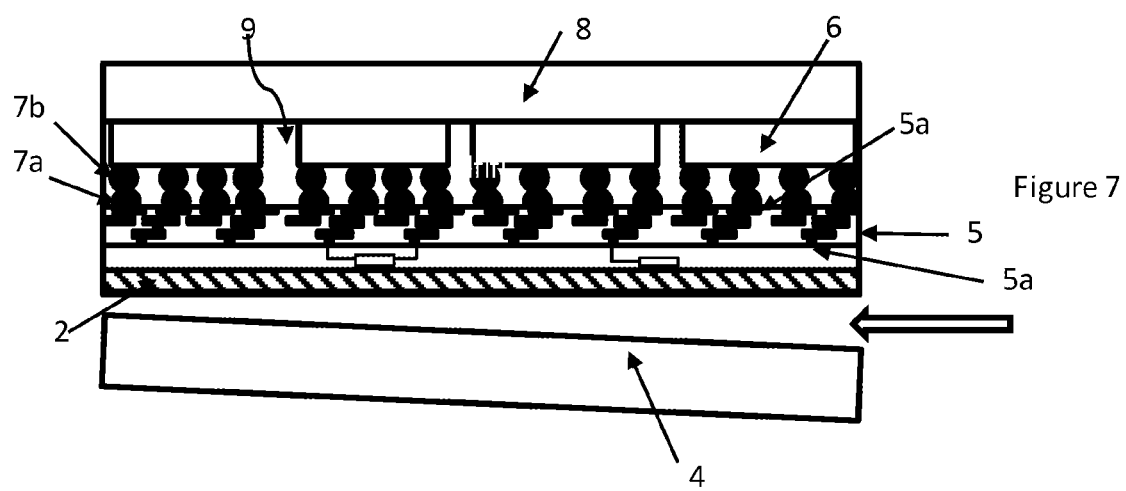
FIG. 7 represents a step of providing energy to the temporary support to detach a residual part.

The method of fabricating the semiconductor structure 10 further comprises a step of providing energy to the temporary support 1 and, in particular, to the plane of weakness 2, to detach the residual part 4 and provide the semiconductor structure 10. This step is represented in FIG. 7.

The provided energy can be a thermal energy, such as annealing around 400° C. and, more generally, between 200° C. and 450° C., for a period of 10 minutes to about 2 hours. Any other thermal treatment that leads to the detachment of the residual part 4 from the temporary support 1 may be suitable. In addition to the thermal treatment (and, in some instances, alternatively to the thermal energy), the provided energy is a mechanical energy, such as the insertion of a blade at the level of the plane of weakness 2 of the temporary support 1.

Figure 8:
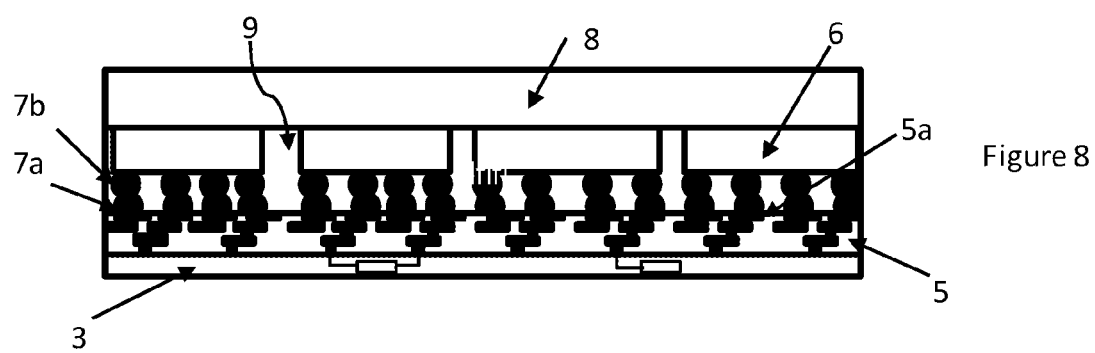
FIG. 8 represents the semiconductor structure after the removal of the residual part of the temporary support.

Whatever its form, the applied energy, in combination with the energy received at the plane of weakness in the preceding steps, leads to the detachment of the residual part 4 of the temporary support 1, to provide the semiconductor structure 10 represented in FIG. 8.

The step of providing thermal energy to the temporary support 1 is particularly advantageous, because it further weakens the plane of weakness and at the same time reinforces the adhesion of the stiffener 8 to the rest of the structure. Therefore, it facilitates the detachment of the residual part 4 of the temporary support 1, and its removal by application of moderate forces, and without the risk of detaching the stiffener 8 from the rest of the structure.

In an optional following step, the superficial layer 3 may be removed, either completely (if no elementary devices 11 have been formed in a previous step) or partly (to preserve the elementary devices 11). Removal can be performed by selective dry or wet etching, for instance, using KOH in the case when the temporary support comprises silicon.

The semiconductor structures 10 that may result from the exposed method are represented on FIGS. 1 and 2.

Naturally, the disclosure is not limited to the particular embodiment of the method that has been described. The disclosure also includes all alternative embodiments or additional steps within the scope of the appended claims.

For instance, elementary devices 11 or additional elementary devices 11 may also be formed in the superficial layer 3, after the step of providing energy and detachment of the residual part 4 of temporary support 1.

In an optional step that can take place after the step of detachment, additional semiconductor chips 6 may be placed over the exposed surface of interconnection layer 5, and electrically coupled to contact pads 5*a*.

As mentioned above, this semiconductor structure 10 may be diced to form raw semiconductor devices, which may then be packaged to form final semiconductor devices as it is usual in the art. Packaging may comprise the formation of wire bonds on some of the contact pads 5*a* disposed on the exposed surface of interconnection layer 5 to provide external connection to the devices.

The invention claimed is:

1. A method of forming a semiconductor structure, the method comprising:
   introducing, at selected conditions, hydrogen and helium species in a temporary support to form a plane of weakness at a predetermined depth therein, and to define a superficial layer and a residual part of the temporary support;
   forming an interconnection layer on the temporary support, the interconnection layer comprising contact pads separated by a dielectric material and electrically conductive paths between the contact pads connecting the contact pads through the dielectric material;
   placing at least one semiconductor chip on the interconnection layer to electrically couple conductive features of the chip with contact pads of the interconnection layer;
   assembling a stiffener on a back side of the at least one semiconductor chip; and
   providing energy to the temporary support to detach the residual part and provide the semiconductor structure.

2. The method of claim 1, wherein the selected conditions of introduction of the helium species comprises implanting helium ions at a dose of between $1 \times 10^{16}$ at/cm$^3$ and $2 \times 10^{16}$ at/cm$^3$, and at an implantation energy of between 40 keV and 200 keV.

3. The method of claim 1, wherein the selected conditions of introduction of the hydrogen species comprises implanting hydrogen ions at a dose of from $0.5 \times 10^{16}$ at/cm$^3$ to $1.5 \times 10^{16}$ at/cm$^3$, and at an implantation energy of between 25 keV and 200 keV.

4. The method of claim 1, wherein the interconnection layer has a first surface on the side of the semiconductor chip and a second surface opposite the first surface, and wherein the contact pads are disposed on both the first surface and the second surface.

5. The method of claim 4, further comprising at least partially removing the superficial layer after the detachment of the residual part to expose at least some contact pads on the second surface of the interconnection layer.

6. The method of claim 4, further comprising forming an emerging feature on the contact pads on the first surface to facilitate the electrical coupling of conductive features of the semiconductor chip with the contact pads.

7. The method of claim 1, further comprising forming elementary devices on and/or in the superficial layer.

8. The method of claim 1, wherein the superficial layer has a thickness less than about 10 micrometers.

9. The method of claim 1, wherein a distance separating two juxtaposed contact pads is between 0.2 micrometer and 2 micrometers.

10. The method of claim 1, wherein the assembling of the stiffener on the back side of the at least one semiconductor chip is performed after the placing of the at least one semiconductor chip on the interconnection layer.

11. The method of claim 1, wherein the assembling of the stiffener on the back side of the at least one semiconductor chip is performed before the placing of the at least one semiconductor chip on the interconnection layer.

12. The method of any one of claim 10 or claim 11, wherein the assembling of the stiffener on the back side of the at least one semiconductor chip further comprises providing a filling material in a free space surrounding the at least one semiconductor chip.

13. The method of claim 1, further comprising dicing the semiconductor structure to provide at least one raw semiconductor device, and packaging the at least one raw semiconductor device to form a final semiconductor device.

14. The method of claim 1, wherein the interconnection layer has a thickness of between 200 nm and 20 micrometers.

15. The method of claim 1, wherein a thermal budget associated with the formation of the interconnection layer is less than 250° C. for 4 hours or is less than 20 minutes at 350° C.

16. The method of claim 1, wherein providing energy to the temporary support comprises applying thermal energy to the temporary support by applying a temperature of between 200° C. and 450° C. for a period of between 10 minutes and 2 hours.

17. The method of claim 1, wherein providing energy to the temporary support comprises providing thermal energy and/or mechanical energy to the temporary support.

18. The method of claim 8, wherein the superficial layer has a thickness of between 50 nm and 600 nm.

* * * * *

UNITED STATES PATENT AND TRADEMARK OFFICE
CERTIFICATE OF CORRECTION

PATENT NO. : 11,114,314 B2  
APPLICATION NO. : 16/305695  
DATED : September 7, 2021  
INVENTOR(S) : Bich-Yen Nguyen et al.

Page 1 of 1

It is certified that error appears in the above-identified patent and that said Letters Patent is hereby corrected as shown below:

On the Title Page  
Item (72), Line 4    change "Malville," to --Maleville,--

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*